US012666752B2

(12) United States Patent
Fang et al.

(10) Patent No.: US 12,666,752 B2
(45) Date of Patent: Jun. 23, 2026

(54) SOLAR CELL AND PREPARATION METHOD THEREOF

(71) Applicant: HENGDIAN GROUP DMEGC MAGNETICS CO., LTD., Jinhua (CN)

(72) Inventors: Chaoyan Fang, Jinhua (CN); Gangfeng Huang, Jinhua (CN); Qingshan Du, Jinhua (CN); Lanlan Ma, Jinhua (CN); Wenrui Wang, Jinhua (CN); Deshuang Chen, Jinhua (CN); Yong Ren, Jinhua (CN)

(73) Assignee: HENGDIAN GROUP DMEGC MAGNETICS CO., LTD., Jinhua (CN)

( * ) Notice: Subject to any disclaimer, the term of this patent is extended or adjusted under 35 U.S.C. 154(b) by 0 days.

(21) Appl. No.: 18/777,607

(22) Filed: Jul. 19, 2024

(65) Prior Publication Data

US 2025/0048779 A1     Feb. 6, 2025

(30) Foreign Application Priority Data

Aug. 4, 2023     (CN) .......................... 202310975523.7

(51) Int. Cl.
H10F 77/30          (2025.01)
H10F 10/14          (2025.01)
(Continued)

(52) U.S. Cl.
CPC ......... H10F 77/311 (2025.01); H10F 10/146 (2025.01); H10F 71/129 (2025.01); H10F 77/703 (2025.01)

(58) Field of Classification Search
CPC .... H10F 10/146; H10F 71/129; H10F 77/211; H10F 77/219; H10F 77/311; H10F 77/703
See application file for complete search history.

(56) References Cited

U.S. PATENT DOCUMENTS

2003/0022065 A1     1/2003   Zhang et al.
2005/0042551 A1     2/2005   Chang et al.
(Continued)

FOREIGN PATENT DOCUMENTS

CN          106024927 A     10/2016
CN          105789342 B     1/2018
(Continued)

OTHER PUBLICATIONS

JP 2016-174154 A English Translation provided by FIT database.*
(Continued)

*Primary Examiner* — Golam Mowla

(57)          ABSTRACT

A solar cell and a method for preparation the solar cell are provided. The solar cell includes a semiconductor substrate, a hole transport layer and an electronic transport layer, a first passivation layer and a second passivation layer. The semiconductor substrate includes a first surface and a second surface opposite to each other. The hole transport layer and the electronic transport layer are disposed on the first surface at interval. A material of the hole transport layer includes vanadium oxide, and a material of the electronic transport layer includes titanium oxide. The first passivation layer is located on a surface of the hole transport layer away from the semiconductor substrate. A surface of the first passivation layer away from the semiconductor substrate, a surface of the electronic transport layer away from the semiconductor substrate, and the first surface are all covered by the second passivation layer.

18 Claims, 4 Drawing Sheets

(51) Int. Cl.
H10F 71/00 (2025.01)
H10F 77/70 (2025.01)

(56) References Cited

U.S. PATENT DOCUMENTS

| | | | | |
|---|---|---|---|---|
| 2013/0112253 A1* | 5/2013 | Oh | ........................ | H10F 10/146 |
| | | | | 136/255 |
| 2016/0276515 A1* | 9/2016 | Chang | ................... | H10F 77/311 |
| 2018/0212083 A1* | 7/2018 | Kim | ...................... | H10F 77/211 |
| 2023/0066259 A1 | 3/2023 | Yu et al. | | |

FOREIGN PATENT DOCUMENTS

| | | |
|---|---|---|
| CN | 106024927 B | 9/2018 |
| CN | 114300546 A | 4/2022 |
| CN | 115172475 A | 10/2022 |
| CN | 115867047 A | 3/2023 |
| CN | 115995500 A | 4/2023 |
| CN | 116314439 A | 6/2023 |
| JP | 2008010746 A | 1/2008 |
| JP | 2014072530 A | 4/2014 |
| JP | 2015015472 A | 1/2015 |
| JP | 2015531550 A | 11/2015 |
| JP | 2016174154 A | 9/2016 |
| JP | 2016213230 A | 12/2016 |
| JP | 2017054912 A | 3/2017 |
| JP | 2017135385 A | 8/2017 |
| JP | 201950329 A | 3/2019 |
| KR | 1020190004952 A | 1/2019 |
| KR | 1020210010728 A | 1/2021 |

OTHER PUBLICATIONS

Notice of rejection decision of JP2024-114358.
International Search Report of PCT/CN2023/127167.
Notice of Reasons for Refusal of JP2024114358.
Second Notice of Reasons for Refusal of JP2024-114358.
European search report of EP24189425.2.
G. Masmitjà et al: "Interdigitated back-contacted crystalline silicon solar cells with low-temperature dopant-free selective contacts", Journal of Materials Chemistry A, vol. 6, No. 9,Jan. 26, 2018 (Jan. 26, 2018), pp. 3977-3985, XP055725441, GB ISSN: 2050-7488, DOI: 10.1039/C7TA11308K.
Masmitjà Gerard et al: "Interdigitated back-contacted crystalline silicon solar cells fully manufactured with atomic layer deposited selective contacts", Solar Energy Materials and Solar Cells, Elsevier Science Publishers, Amsterdam, NL,vol. 240, Apr. 2, 2022 (Apr. 2, 2022), XP087019408,ISSN: 0927-0248, DOI:10.1016/J.SOLMAT. 2022.111731[retrieved on Apr. 2, 2022].
Wang Yanhao et al: "Dopant-freepassivating contacts for crystalline silicon solar cells: Progress andprospects", ECOMAT,vol. 5, No. 2,Oct. 11, 2022 (Oct. 11, 2022), pp. 1-29, XP093235312,ISSN: 2567-3173, DOI: 10.1002/eom2.12292.

* cited by examiner

SOLAR CELL AND PREPARATION METHOD THEREOF

CROSS-REFERENCE TO RELATED APPLICATION

This application claims priority to Chinese patent application No. 202310975523.7, filed on Aug. 4, 2023, and titled "SOLAR CELL AND PREPARATION METHOD THEREOF". The content of the above identified application is hereby incorporated herein in their entirety by reference.

TECHNICAL FIELD

The present disclosure relates to a field of solar cell technology, and in particular, to a solar cell and a preparation method thereof.

BACKGROUND

Compared to passivated emitter and rear cell (i.e., PERC cell) and heterojunction cells (i.e. HJT cell), interdigital back contact solar cell (i.e., IBC solar cell) does not have grid lines on a front side thereof, and positive electrode and negative electrode of the interdigital back contact solar cell are prepared in a cross arrangement on a back side of the interdigital back contact solar cell, which can avoid shading losses caused by an obstruction of front gate lines in the interdigital back contact solar cell. In a traditional IBC solar cell, staggered N-type doped semiconductor regions and P-type doped semiconductor regions are formed at interval by diffusion, and then holes are defined on a dielectric layer to achieve electrical contact connection between an electrode and an emission region. In such traditional IBC solar cell, poor electrical contact quality between the electrode and a semiconductor region limits further improvement of a photoelectric conversion efficiency of the IBC solar cell.

SUMMARY

According to various embodiments of the present disclosure, a solar cell and a preparation method thereof are provided.

On a first aspect, the present disclosure provides a solar cell. The solar cell includes a semiconductor substrate, a hole transport layer and an electronic transport layer, a first passivation layer, and a second passivation layer. The semiconductor substrate includes a first surface and a second surface opposite to each other. The hole transport layer and the electronic transport layer are disposed on the first surface of the semiconductor substrate at interval, a material of the hole transport layer includes a vanadium oxide, a material of the electronic transport layer includes a titanium oxide. The first passivation layer is located on a surface of the hole transport layer away from the semiconductor substrate. A surface of the first passivation layer away from the semiconductor substrate, a surface of the electronic transport layer away from the semiconductor substrate, and the first surface of the semiconductor substrate are all covered by the second passivation layer.

In some embodiments, a thickness of the hole transport layer is in a range of 20 nm to 30 nm.

In some embodiments, a thickness of the electronic transport layer is in a range of 45 nm to 55 nm.

In some embodiments, a material of the first passivation layer includes aluminum oxide.

In some embodiments, a material of the second passivation layer includes at least one of silicon oxide, silicon nitride, silicon carbide, or silicon oxynitride.

In some embodiments, the second surface of the semiconductor substrate is a textured surface.

In some embodiments, the solar cell further includes a third passivation layer and the third passivation layer is disposed on the second surface of the semiconductor substrate.

In some embodiments, the solar cell further includes a fourth passivation layer and the fourth passivation layer is disposed on a surface of the third passivation layer away from the semiconductor substrate, and a material of the fourth passivation layer is different from that of the third passivation layer.

On the second aspect, the present disclosure further provides a method for preparation the above solar cell, which includes following steps:

providing the semiconductor substrate including the first surface and second surface opposite to each other.

forming the hole transport layer and the electronic transport layer on the first surface of the semiconductor substrate at interval, wherein the material of the hole transport layer includes vanadium oxide, the material of the electronic transport layer comprises titanium oxide.

forming the first passivation layer on the surface of the hole transport layer away from the semiconductor substrate; and forming the second passivation layer to cover the surface of the first passivation layer away from the semiconductor substrate, the surface of the electronic transport layer away from the semiconductor substrate, and the first surface of the semiconductor substrate.

In some embodiments, preparation the hole transport layer includes:

forming the hole transport layer by an atomic layer deposition method at 120° C. to 130° C. and using a vanadium source and a first oxidant, or forming the hole transport layer by a plasma enhanced chemical vapor deposition method at 380° C. to 420° C. and using a vanadium source and a second oxidant.

In some embodiments, preparation the electronic transport layer includes:

forming the electronic transport layer by an atomic layer deposition method at 100° C. to 160° C. and using a titanium source and a first oxidant, or forming the electronic transport layer by a plasma enhanced chemical vapor deposition method at 380° C. to 420° C. and using a titanium source and a second oxidant.

The details of one or more embodiments of this application are presented in the accompanying drawings and description below. The other features, purposes, and advantages of this application will become apparent from the description, drawings, and claims.

BRIEF DESCRIPTION OF THE DRAWINGS

For a better description and illustration of embodiments and/or examples of those disclosures disclosed herein, reference may be made to one or more attached drawings. Additional details or examples used to describe the drawings should not be considered as limiting the scope of any of the disclosed disclosures, currently described embodiments and/or examples, and currently understood best modes of these disclosures.

Figures 1, 2:
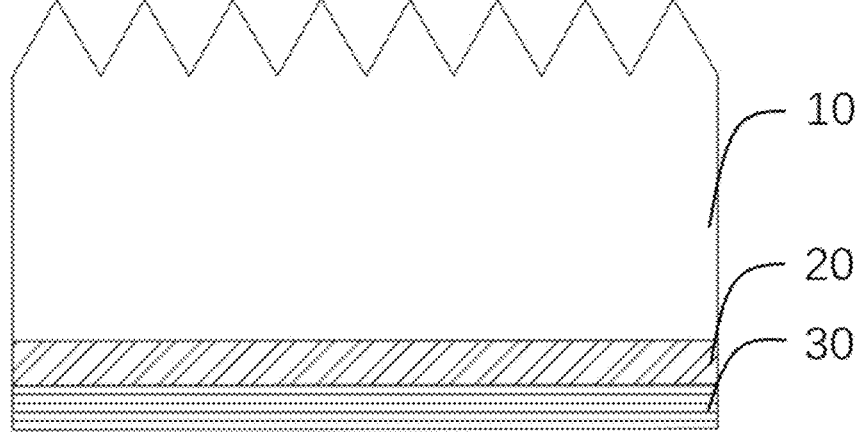
FIG. 1 is a schematic diagram of preparation a hole transport layer and a first passivation layer on a surface of a semiconductor substrate of one or more embodiments in the present disclosure.
FIG. 2 is a schematic diagram of forming a first mask layer and a second mask layer on a basis of a structure in FIG. 1.

Reference signs are as follows: 10 represents a semiconductor substrate; 21 represents a hole transport layer; 22 represents a first passivation layer; 31 represents a first mask layer; 32 represents a second mask layer; 40 represents an electronic transport layer; 50 represents a second passivation layer; 61 represents a third passivation layer; 62 represents a fourth passivation layer; 71 represents a first electrode; and 72 represents a second electrode.

DETAILED DESCRIPTION

In order to make above objectives, features, and advantages of this disclosure more obvious and understandable, a detailed explanation of detail description of this disclosure will be provided below in conjunction with drawings. Many specific details are described in following description to facilitate a thorough understanding of this disclosure. However, this disclosure can be implemented in many ways different from the other described herein, and those skilled in the art can make similar improvements without violating content of this disclosure. Therefore, this disclosure is not limited by the specific examples disclosed below.

Unless otherwise defined, all technical and scientific terms used in this article have the same meanings as those commonly understood by those skilled in the art of this disclosure. The terms used in the specification of this disclosure are only for the purpose of describing specific examples and are not intended to limit this disclosure. The term "and/or" used in this article includes any and all combinations of one or more related listed items.

In one embodiment of the present disclosure, a solar cell is provided. The solar cell includes a semiconductor substrate 10, a hole transport layer 21 and an electronic transport layer 40, a first passivation layer 22, and a second passivation layer 50. The semiconductor substrate 10 includes a first surface and a second surface opposite to each other. The hole transport layer 21 and the electronic transport layer 40 are disposed on the first surface of the semiconductor substrate at interval. A material of the hole transport layer 21 includes a vanadium oxide, and a material of the electronic transport layer 40 includes a titanium oxide. The first passivation layer 22 is located on a surface of the hole transport layer 21 away from the semiconductor substrate 10. A surface of the first passivation layer 22 away from the semiconductor substrate 10, a surface of the electronic transport layer 40 away from the semiconductor substrate 10, and the first surface of the semiconductor substrate 10 are all covered by the second passivation layer 50.

In the solar cell, the material of the hole transport layer 21 includes a vanadium oxide, and the vanadium oxide is in a state of hole selectivity. The material of the electronic transport layer 40 includes titanium oxide, and titanium oxide is in a state of electronic selectivity. In the present disclosure, the hole transport layer 21 is cooperated with the electronic transport layer 40, and schottky barrier between the hole transport layer 21 and an electrode and schottky barrier between the electronic transport layer 40 and an electrode are relatively low, facilitating a relatively great transmission effect of photo-generated carriers. Meanwhile, the surface of the hole transport layer 21 is laminated and passivated with two different materials, which can effectively improve a surface contact effect between the passivated hole transport layer 21 and the electrode. In such solar cell, it can realize excellent electric contact effect between the electrode and the hole transport layer 21 and between the electrode and the electronic transport layer 40, thereby realizing a relatively high photoelectric conversion efficiency of the IBC solar cell.

In some embodiments, the material of the hole transport layer 21 is vanadium oxide.

In some embodiments, the material of the electronic transport layer 40 is titanium oxide.

In some embodiments, a thickness of the hole transport layer 21 is in a range of 20 nm to 30 nm. In such thickness range of the hole transport layer 21, film quality of the hole transport layer 21 is excellent, and the obtained cell has an excellent selective contact effect. Alternatively, the thickness of the hole transport layer 21 can be 20 nm, 21 nm, 22 nm, 23 nm, 24 nm, 25 nm, 26 nm, 27 nm, 28 nm, 29 nm or 30 nm.

In some embodiments, a thickness of an electronic transport layer 40 is in a range of 45 nm to 55 nm. In such thickness range of the electronic transport layer 40, film quality of the electronic transport layer 40 is excellent, and the obtained cell has an excellent selective contact effect. Alternatively, the thickness of the electronic transport layer 40 can be 45 nm, 46 nm, 47 nm, 48 nm, 49 nm, 50 nm, 51 nm, 52 nm, 53 nm, 54 nm or 55 nm.

In some embodiments, a material of the first passivation layer 22 includes aluminum oxide. A cooperation between aluminum oxide and an N-type semiconductor material is excellent, which can have a greatly passivate effect on the hole transport layer 21 to obtain a solar cell with an excellent contact effect.

In some embodiments, the material of the first passivation layer 22 is aluminum oxide.

In some embodiments, the material of the second passivation layer 50 includes at least one of silicon oxide, silicon nitride, silicon carbide, or silicon oxynitride.

In some embodiments, the second surface of the semiconductor substrate is a textured surface. The textured surface can be a textured surface with different shapes. For example, the textured surface can be a pyramid textured surface.

In some embodiments, the third passivation layer 61 can be further disposed on the second surface of the semiconductor substrate 10. By depositing the third passivation layer 61 one the front side of the cell, it can further improve a photoelectric performance of the solar cell.

In some embodiments, the material of the third passivation layer 61 includes at least one of aluminium oxide, silicon oxide, silicon nitride, silicon carbide, or silicon oxynitride.

In some embodiments, a fourth passivation layer 62 is further disposed on a surface of the third passivation layer 61 away from the semiconductor substrate 10. A material of the fourth passivation layer 62 is different from that of the third passivation layer 61. By disposing the third passivation layer 61 and the fourth passivation layer 62 laminated on the front side of the cell, it can further improve the photoelectric performance of the solar cell.

In some embodiments, a material of the fourth passivation layer 62 includes at least one of aluminium oxide, silicon oxide, silicon nitride, silicon carbide, or silicon oxynitride.

In some embodiments, the material of the third passivation layer 61 is different from that of the fourth passivation layer 62.

In some embodiments, a material of the semiconductor substrate 10 includes an N-type monocrystalline silicon wafer.

In some embodiments, the solar cell further includes a first electrode 71 and a second electrode 72. The first electrode 71 is located on a surface of the second passivation layer 50 configured for covering the first passivation layer 22 and away from the semiconductor substrate 10, and the second electrode 72 is located on a surface of the second passivation layer 50 configured for covering the electronic transport layer 40 and away from the semiconductor substrate 10.

In another embodiment of the present disclosure, a method for preparation the above solar cells is provided. The preparation method includes following steps:

providing a semiconductor substrate 10 including a first surface and a second surface opposite to each other;

forming a hole transport layer 21 and an electronic transport layer 40 on the first surface of the semiconductor substrate 10 at interval, wherein a material of the hole transport layer 21 includes vanadium oxide, and a material of the electronic transport layer 40 includes titanium oxide;

forming a first passivation layer 22 on a surface of the hole transport layer 21 away from the semiconductor substrate 10; and forming a second passivation layer 50 to cover a surface of the first passivation layer 22 away from the semiconductor substrate 10, a surface of the electronic transport layer 40 away from the semiconductor substrate 10, and the first surface of the semiconductor substrate 10.

In some examples of such embodiment, the preparation method of the solar cell includes step 100 to step 500.

Step 100 includes providing a semiconductor substrate including a first surface and a second surface opposite to each other.

In some examples, step 100 further includes cleaning the semiconductor substrate 10 to remove an impurity on a surface of the semiconductor substrate 10.

In some examples, the step of cleaning the semiconductor substrate 10 includes cleaning the semiconductor substrate 10 by a mixed solution of potassium hydroxide solution and hydrogen peroxide solution.

In some examples, after cleaning the semiconductor substrate 10, it further includes texturing the cleaned semiconductor substrate 10 to form a textured surface on the cleaned semiconductor substrate 10.

In some examples, the step of texturing the cleaned semiconductor substrate 10 includes processing an anisotropic etching on the cleaned semiconductor substrate 10 by an etching solution to form a pyramid textured surface on the cleaned semiconductor substrate 10.

In some examples, the etching solution includes a potassium hydroxide solution.

Step 200 includes forming the hole transport layer 21 and the electronic transport layer 40 on the first surface of the semiconductor substrate 10 at interval. A material of the hole transport layer 21 includes vanadium oxide, and a material of the electronic transport layer 40 includes titanium oxide.

In some examples, the step of preparation the hole transport layer 21 includes: forming the hole transport layer 21 by an atomic layer deposition method at 120° C. to 130° C. and using a vanadium source and a first oxidant. In such temperature range of the atomic layer deposition method, the hole transport layer 21 with an excellent film-forming effect and sealing performance can be obtained. Meanwhile, a relatively low deposition temperature can reduce a damage of passivation stability of the hole transport layer 21 when under a relatively high temperature. For example, a temperature of the atomic layer deposition method can be 120° C., 121° C., 122° C., 123° C., 124° C., 125° C., 126° C., 127° C., 128° C., 129° C. or 130° C. For example, the vanadium source of the atomic layer deposition method includes tetra (ethyl methyl amino) vanadium (IV). For example, the first oxidant of the atomic layer deposition method includes deionized water.

In some examples, circulation number of the atomic layer deposition is in a range of 160 times to 240 times. In such circulation number of the atomic layer deposition, the hole transport layer 21 with an appropriate thickness can be obtained. For example, the circulation number of the atomic layer deposition can be 160 times, 170 times, 180 times, 190 times, 200 times, 210 times, 220 times, 230 times, or 240 times.

In some examples, the step of forming the hole transport layer 21 includes: forming the hole transport layer 21 by plasma enhanced chemical vapor deposition at 380° C. to 420° C. and using a vanadium source and a second oxidant. In such temperature range of the plasma enhanced chemical vapor deposition, the hole transport layer 21 with an excellent film-forming effect and sealing performance can be obtained, and meanwhile, a relatively low deposition temperature can reduce a damage for passivation stability of the hole transport layer 21 when under a relatively high temperature. For example, the temperature of the plasma enhanced chemical vapor deposition can be 380° C., 385° C., 390° C., 395° C., 400° C., 405° C., 410° C., 415° C. and 420° C. Alternatively, the vanadium source of the plasma enhanced chemical vapor deposition includes tetra (ethyl methyl amino) vanadium (IV). The second oxidant of the plasma enhanced chemical vapor deposition includes $N_2O$.

In some examples, the step of forming the electronic transport layer 40 includes: forming the electronic transport layer 40 using a titanium source and a first oxidant by atomic layer deposition at 100° C. to 160° C.

In some examples, the step of forming the electronic transport layer 40 includes: forming the electronic transport layer 40 by plasma enhanced chemical vapor deposition at 380° C. to 420° C. and using the titanium source and the second oxidant.

Step 300 includes forming the first passivation layer 22 on the surface of the hole transport layer 21 away from the semiconductor substrate 10.

Figure 3:
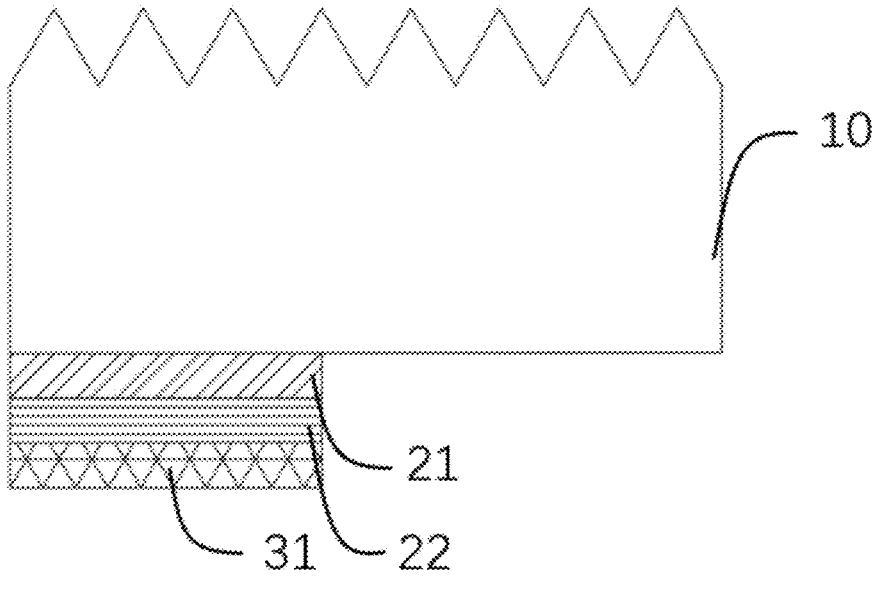
FIG. 3 is a schematic diagram of removing a part of the hole transport layer and a dielectric layer on a basis of a structure in FIG. 2.
Figure 4:
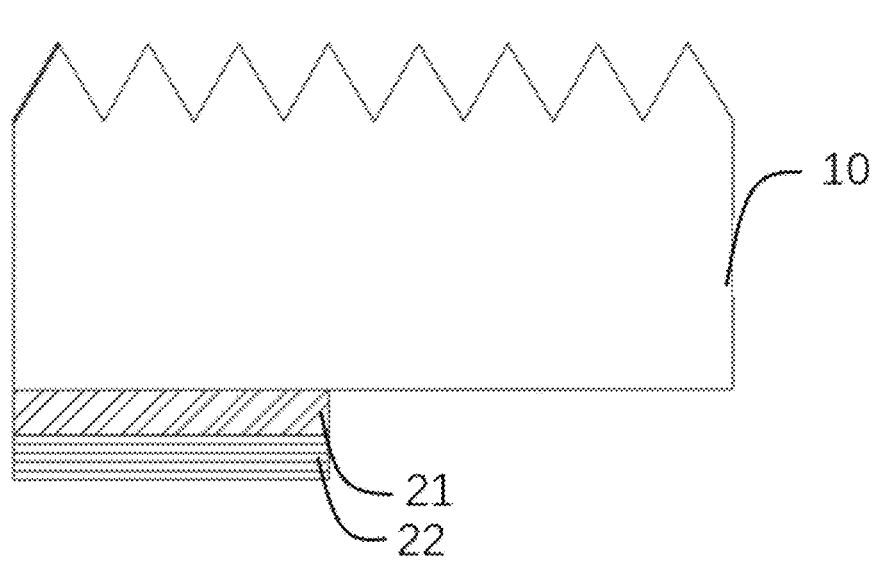
FIG. 4 is a schematic diagram of removing a first mask layer on a basis of a structure in FIG. 3.
Figure 5:
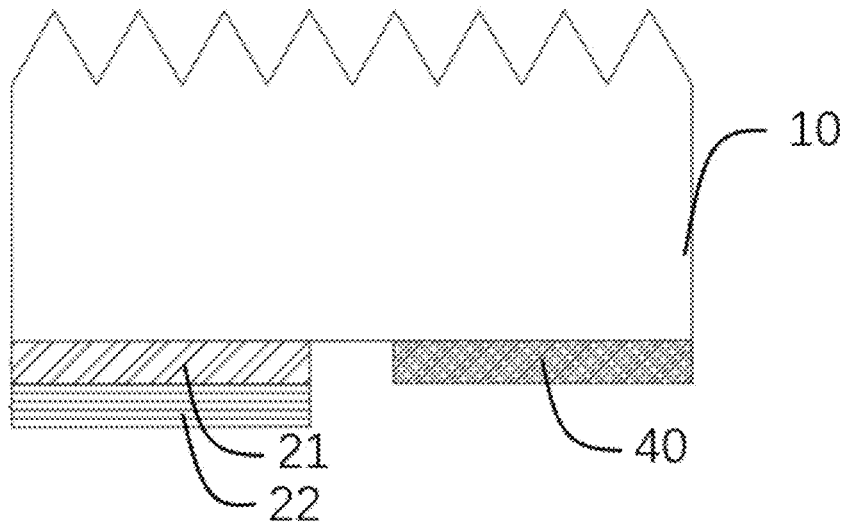
FIG. 5 is a schematic diagram of forming an electronic transport layer on a basis of a structure in FIG. 4.

In some examples, referring to FIGS. 1 to 5, FIG. 1 is a schematic diagram of forming a hole transport layer 21 and a first passivation layer 22 on a surface of a semiconductor substrate 10. FIG. 2 is a schematic diagram of forming a first mask layer 31 and a second mask layer 32 on a basis of a structure in FIG. 1. FIG. 3 is a schematic diagram of removing a part of the hole transport layer 21 and a dielectric layer on a basis of a structure in FIG. 2. FIG. 4 is a schematic diagram of removing a first mask layer 31 on a basis of a structure in FIG. 3. FIG. 5 is a schematic diagram of preparation an electronic transport layer 40 on a basis of a structure in FIG. 4. The hole transport layer 21, the electronic transport layer 40, and the first passivation layer 22 are prepared by following steps: forming the hole transport layer 21 and the first passivation layer 22 successively laminated on the semiconductor substrate 10; forming the first mask layer 31 and the second mask layer 32 on a surface of the first passivation layer 22, wherein the first mask layer 31 can not be removed by a developing solution, and the second mask layer 32 can be removed by the developing solution; removing the second mask layer 32 and etching the first passivation layer 22 and the hole transport layer 21 which are exposed; and removing the first mask layer 31 and forming the electronic transport layer 40 on the surface of the semiconductor substrate 10.

In some examples, a material of the first mask layer 31 includes photosensitive polyimide. In some embodiments, a material of a second mask layer 32 includes photosensitive polyimide.

Step 400 includes: forming the second passivation layer 50 to cover a surface of the first passivation layer 22 away from the semiconductor substrate 10, a surface of the electronic transport layer 40 away from the semiconductor substrate 10, and the first surface of the semiconductor substrate 10.

Figure 6:
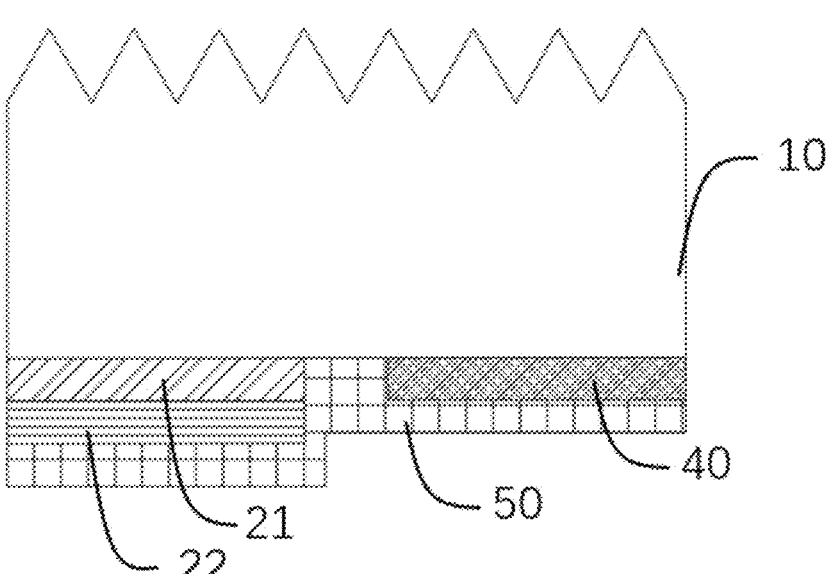
FIG. 6 is a schematic diagram of forming a first passivation layer on a basis of a structure in FIG. 5.

FIG. 6 is a schematic diagram of forming the first passivation layer 22 on a basis structure in FIG. 5. Referring to FIG. 6, the surface of the first passivation layer 22 away from the semiconductor substrate 10, the surface of an electronic transport layer 40 away from the semiconductor substrate 10, and the first surface of the semiconductor substrate 10 are all covered by the second passivation layer 50.

Step 500 includes: forming the first electrode 71 and the second electrode 72. The first electrode 71 is located on a surface of the second passivation layer 50 covering the first passivation layer 22 and away from the semiconductor substrate 10, and the second electrode 72 is located on a surface of the second passivation 50 covering the electronic transport layer 40 and away from the semiconductor substrate 10.

Figure 8:
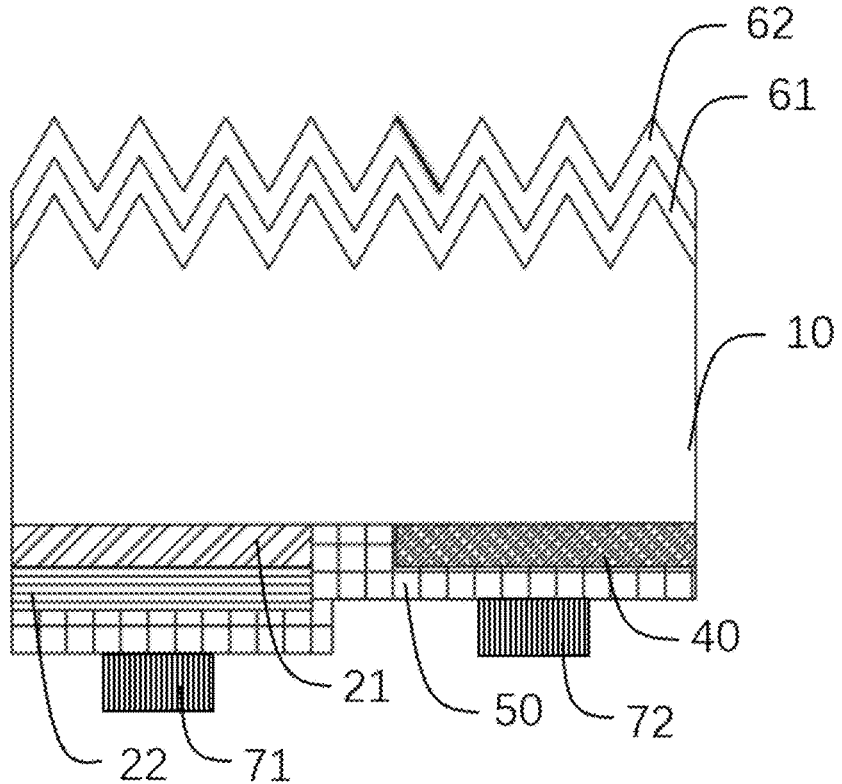
FIG. 8 is a schematic diagram of forming a first electrode and a second electrode on the basis of the structure in FIG. 6.

FIG. 8 is a schematic diagram of forming the first electrode 71 and the second electrode 72 on a basis of a structure in FIG. 6. Referring to FIG. 8, the first electrode 71 is located on the surface of the second passivation layer 50 covering the first passivation layer 22 and away from the semiconductor substrate 10, and the second electronic 72 is located on a surface of the second passivation layer 50 covering the electronic transport layer 40 and away from the semiconductor substrate 10.

In some examples, the materials of the first electrode 71 and the second electrode 72 are individually selected from usable metal electrodes in the art. For example, the first electrode 71 is a silver electrode. For example, the material of the second electrode 72 includes nickel and aluminum.

In some examples, the method further includes: forming the third passivation layer 61 on the second surface of the semiconductor substrate 10.

In some examples, the method further includes: forming the fourth passivation layer 62 on a surface of the third passivation layer 61.

Figure 7:
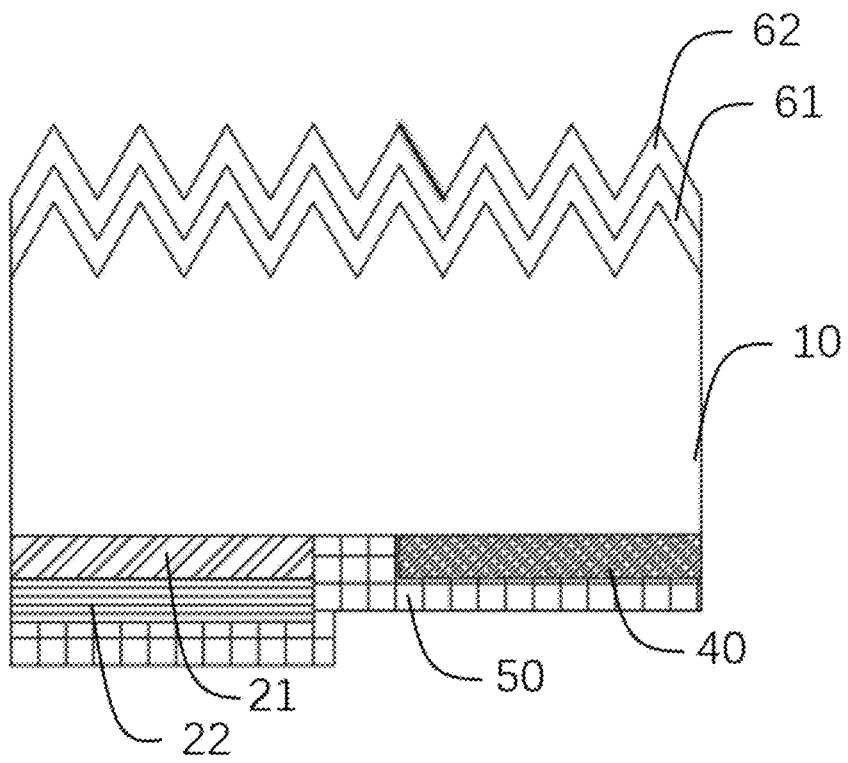
FIG. 7 a schematic diagram of forming a third passivation layer and a fourth passivation layer on a basis of a structure in FIG. 6.

FIG. 7 is a schematic diagram of forming the third passivation layer 61 and the fourth passivation layer 62 on a basis in FIG. 6. Referring to FIG. 7, the third passivation layer 61 is disposed on the second surface of the semiconductor substrate 10, and the fourth passivation layer 62 is disposed on a surface of the third passivation layer 61 away from the semiconductor substrate 10.

Some specific examples are as below to explain the method and the solar cell.

Example 1

Referring to FIGS. 1 to 8, a method for preparation the solar cell includes following steps.

(1) At 70° C., a mixture of potassium hydroxide solution and hydrogen peroxide solution was used to clean a semiconductor substrate 10 for about 90 s, so as to remove an impurity of a surface of a silicon wafer.

(2) At 78° C., the potassium hydroxide solution and an additive were used to texture a front side of the silicon surface in chain for about 450 s, so as to form a pyramid textured surface on a front surface of the silicon wafer as a trapping structure.

(3) At 120° C. to 130° C., an ALD device was used, tetra (ethyl methyl amino) vanadium (IV) and deionized water were used as a precursor and an oxidant, respectively, circulations were processed 160 times to 240 times, an vanadium oxide film with a thickness of 20 nm to 30 nm was prepared as a hole transport layer 21.

(4) At 190° C. to 210° C., the ALD device was used, trimethyl aluminum (TMA) and the deionized water were used as a precursor and an oxidant, respectively, circulations were processed 450 times to 550 times, an aluminum oxide film with a thickness of 45 nm to 55 nm was prepared as a first passivation layer 22.

(5) Photosensitive polyimide was used to prepare a patterned mask layer. A first mask layer 31 and a second mask layer 32 were obtained by utilizing photochemical reactions. A part of the hole transport layer 21 and a part of the first passivation layer 22 covered by the second mask layer 32 were removed by dry etching.

(6) The first mask layer 31 was removed.

(7) At 100° C. to 200° C., the ALD device was used, titanium tetraisopropanolate and the deionized water were used as a precursor and an oxidant, respectively, circulations were processed 225 times to 275 times, a titanium oxide film with a thickness of 22.5 nm to 27.5 nm was prepared as an electronic transport layer 40.

(8) Silane and methane were used as silicon source and carbon source, $H_2$ was used as a carrier gas, a silicon carbide thin film with a thickness of 20 nm was prepared as a second passivation layer 50.

(9) An aluminum oxide thin film was prepared on the front side of the silicon wafer as the third passivation layer 61 by using same condition of the step (4), and a silicon carbide thin film was prepared on the front side of the silicon wafer as a fourth passivation layer 62 by using same condition of the step (8).

(10) An annealing treatment was processed at 380° C. to 420° C. for 10 min, so as to activate surface passivation of the silicon carbide thin film.

(11) A silver first electrode 71 and a nickel aluminum second electrode 72 were prepared, respectively.

Example 2

This example is substantially the same as example 1, except that:

in step (3), at 400° C., plasma enhanced chemical vapor deposition device was used, tetra (ethyl methyl amino) vanadium (IV) and $N_2O$ were used as a precursor and an oxidant, respectively, and a vanadium oxide film with a thickness of 20 nm to 30 nm was prepared as a hole transport layer 21; and in step (7), at 400° C., ALD device and the plasma enhanced chemical vapor deposition device were used, titanium tetraisopropanolate and $N_2O$ were used as a precursor and an oxidant, respectively, and a titanium oxide thin film with the thickness of 22.5 nm to 27.5 nm was prepared as an electronic transport layer 40.

Comparative Example 1

In the comparative example 1, a method for preparation a solar cell includes following steps.

(1) At 70° C., a mixture of a potassium hydroxide solution and a hydrogen peroxide solution was used to clean a semiconductor substrate 10 for about 90 s, so as to remove an impurity of a surface of a silicon wafer.

(2) At 78° C., the potassium hydroxide solution and an additive were used to texture a front side of the silicon surface in chain for about 450 s, so as to form a pyramid textured surface on the front side of the silicon wafer as a trapping structure.

(3) At 600° C., an intrinsic amorphous silicon layer was deposited on a back side of the silicon wafer by low-pressure chemical vapor deposition.

(4) Boron diffusion was processed at 1000° C. to form P-type polycrystalline silicon as P region, i.e., a hole transport layer 21.

(5) Photosensitive polyimide was used to prepare a patterned mask layer, a first mask layer 31 and a second mask layer 32 were obtained by utilizing photochemical reactions, and a part of the hole transport layer 21 covered by the second mask layer 32 was removed by dry etching.

(6) The first mask layer 31 was removed.

(7) Phosphorus diffusion was processed at 900° C. to form N-type polycrystalline silicon as N region, i.e., an electron transport layer 40.

(8) Silane and methane were used as silicon and carbon sources, $H_2$ was used as a carrier gas, a silicon carbide thin film with a thickness of 20 nm was formed as a second passivation layer 50.

(9) An aluminum oxide thin film was prepared on a front side of the silicon wafer as a third passivation layer 61 by using same condition of the step (4), and a silicon carbide thin film was prepared on the front side of the silicon wafer as a fourth passivation layer 62 by using same condition of the step (8).

(10) An annealing treatment was processed at a temperature of 380° C. to 420° C. for 10 min, so as to activate surface passivation of the silicon carbide thin film.

(11) A silver first electrode 71 and a nickel aluminum second electrode 72 were prepared, respectively.

The solar cells obtained from examples 1 to 2 and comparative example 1 were tested for the quality, including an open circuit voltage $U_{oc}$, a short circuit current $I_{sc}$, a fill factor FF, and a conversion efficiency $E_{ta}$, and the test result were shown in Table. 1.

TABLE 1

| Number | $U_{oc}$(V) | $I_{sc}$(mA/cm$^{2)}$ | FF(%) | $E_{ta}$(%) | Yield(%) |
| --- | --- | --- | --- | --- | --- |
| Comparative example 1 | 0.633 | 40.0 | 75.6 | 19.2 | 90 |
| Example 1 | 0.652 | 39.2 | 81.1 | 21.3 | 99.5 |
| Example 2 | 0.645 | 39.2 | 80.9 | 20.9 | 99.4 |

It can be seen that, photoelectric conversion efficiency and open circuit voltage of solar cells of examples 1 to 2 are higher than that of a solar cell of comparative example 1. Yield of the solar cells of examples 1 to 2 are higher than that of the solar cell of comparative example 1, which means that high temperature will influence warpage of the silicon wafer, therefore, the yield of the comparative example 1 is relatively low. Furthermore, compares with that of example 1, open circuit voltage of the solar cell of example 2 is relatively low, due to that film formed by plasma enhanced chemical vapor deposition is not dense sufficiently, therefore, a passivation effect of a film prepared by atomic layer deposition in the example 1 is inferior to that in the example 2.

The various technical features of above example can be combined in any way. To make the description concise, all possible combinations of the various technical features in the above examples have not been described. However, as long as there is no contradiction in the combination of these technical features, they should be considered within the scope of this specification.

The above examples only express several examples of the present disclosure, and their description is more specific and detailed, but cannot be understood as a limitation on the scope of the present disclosure. It should be pointed out that for ordinary skill in the art, several modifications and improvements can be made without departing from the concept of this disclosure, all of which fall within the scope of protection of this disclosure. Therefore, the scope of protection of this patent disclosure should be based on the attached claims, and the specification and drawings can be used to explain the content of the claims.

What is claimed is:

1. A solar cell comprises:

a semiconductor substrate comprising a first surface and a second surface opposite to each other;

a hole transport layer and an electronic transport layer, wherein the hole transport layer and the electronic transport layer are disposed on the first surface of the semiconductor substrate at interval, a material of the hole transport layer comprises vanadium oxide, a material of the electronic transport layer comprises titanium oxide;

a first passivation layer merely located on and being in contact with a surface of the hole transport layer away from the semiconductor substrate; and a second passivation layer, wherein a material of the second passivation layer is different from that of the first passivation layer, a surface of the first passivation layer away from the semiconductor substrate, a surface of the electronic transport layer away from the semiconductor substrate, and the first surface of the semiconductor substrate are all covered by and in contact with the second passivation layer.

2. The solar cell of claim 1, wherein a thickness of the hole transport layer is in a range of 20 nm to 30 nm.

3. The solar cell of claim 1, wherein a thickness of the electronic transport layer is in a range of 45 nm to 55 nm.

4. The solar cell of claim 1, wherein the material of the first passivation layer comprises aluminum oxide.

5. The solar cell of claim 1, wherein the material of the second passivation layer comprises at least one of silicon oxide, silicon nitride, silicon carbide, or silicon oxynitride.

6. The solar cell of claim 1, wherein the second surface of the semiconductor substrate is a textured surface.

7. The solar cell of claim 6, further comprising a third passivation layer, wherein the third passivation layer is disposed on the second surface of the semiconductor substrate.

8. The solar cell of claim 7, further comprising a fourth passivation layer, wherein the fourth passivation layer is disposed on a surface of the third passivation layer away from the semiconductor substrate, and a material of the fourth passivation layer is different from that of the third passivation layer.

9. A method for preparation the solar cell of claim 1, comprising:

providing the semiconductor substrate comprising the first surface and second surface opposite to each other;

forming the hole transport layer and the electronic transport layer on the first surface of the semiconductor substrate at interval, wherein the material of the hole transport layer comprises vanadium oxide, the material of the electronic transport layer comprises titanium oxide;

forming the first passivation layer on the surface of the hole transport layer away from the semiconductor substrate; and forming the second passivation layer to cover the surface of the first passivation layer away from the semiconductor substrate, the surface of the electronic transport layer away from the semiconductor substrate, and the first surface of the semiconductor substrate.

10. The method of claim 9, wherein preparation the hole transport layer further comprises:

forming the hole transport layer by an atomic layer deposition method at 120° C. to 130° C. and using a vanadium source and a first oxidant;

or forming the hole transport layer by a plasma enhanced chemical vapor deposition method at 380° C. to 420° C. and using a vanadium source and a second oxidant.

11. The method of claim 9, wherein preparation the electronic transport layer comprises:

forming the electronic transport layer by an atomic layer deposition method at 100° C. to 160° C. and using a titanium source and a first oxidant;

or forming the electronic transport layer by a plasma enhanced chemical vapor deposition method at 380° C. to 420° cand using a titanium source and a second oxidant.

12. The method of claim 9, wherein a thickness of the hole transport layer is in a range of 20 nm to 30 nm.

13. The method of claim 9, wherein a thickness of the electronic transport layer is in a range of 45 nm to 55 nm.

14. The method of claim 9, wherein the material of the first passivation layer comprises aluminum oxide.

15. The method of claim 9, wherein the material of the second passivation layer comprises at least one of silicon oxide, silicon nitride, silicon carbide, or silicon oxynitride.

16. The method of claim 9, wherein the second surface of the semiconductor substrate is a textured surface.

17. The method of claim 16, wherein after forming the second passivation layer, the method further comprises a step of forming a third passivation layer on the second surface of the semiconductor substrate.

18. The method of claim 16, wherein after forming the third passivation layer, the method further comprises a step of forming a fourth passivation layer on a surface of the third passivation layer away from the semiconductor substrate, and a material of the fourth passivation layer is different from that of the third passivation layer.

* * * * *